(12) United States Patent
Tan et al.

(10) Patent No.: US 8,183,883 B1
(45) Date of Patent: May 22, 2012

(54) INTEGRATED CIRCUIT RECONFIGURATION TECHNIQUES

(75) Inventors: Chee Seng Tan, Tarman Tanjung (MY); Chai Sia Tan, Bukit Gambir (MY); Elden Chau, San Jose, CA (US); John Tse, San Jose, CA (US); Neville Carvalho, Campbell, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/762,295

(22) Filed: Apr. 16, 2010

(51) Int. Cl.
*H03K 19/177* (2006.01)
*G06F 7/38* (2006.01)
(52) U.S. Cl. .................. 326/39; 326/41; 710/13
(58) Field of Classification Search ............. 326/38–41; 365/189.07; 707/102
See application file for complete search history.

(56) References Cited

U.S. PATENT DOCUMENTS

| | | | |
|---|---|---|---|
| 6,363,019 B1 * | 3/2002 | Erickson et al. | 365/189.07 |
| 7,007,036 B2 * | 2/2006 | McCarty et al. | 711/114 |
| 7,081,773 B1 * | 7/2006 | May et al. | 326/38 |
| 7,623,391 B1 * | 11/2009 | Wong et al. | 365/189.07 |
| 2009/0271533 A1 * | 10/2009 | Asnaashari | 710/13 |

* cited by examiner

*Primary Examiner* — Shawki S Ismail
*Assistant Examiner* — Crystal L Hammond
(74) *Attorney, Agent, or Firm* — Womble Carlyle Sandridge & Rice LLP

(57) ABSTRACT

A memory configuration circuit is provided. The memory configuration circuit may be integrated into a programmable logic device (PLD) and as such, may be used to configure and reconfigure specific elements in the PLD. The memory configuration circuit includes a comparator circuit and a counter. The comparator circuit is coupled to receive two data words from two different memory configuration sources. The comparator circuit compares the two data words received before writing one of the data words to a configuration memory. One of the data words may be written to the configuration memory if the two data words compared are not equal. The counter increments the address of the memory configuration sources so that a next data word can be processed after the current data word is processed.

19 Claims, 8 Drawing Sheets

INTEGRATED CIRCUIT RECONFIGURATION TECHNIQUES

BACKGROUND

Programmable logic devices (PLDs) are integrated circuits (ICs) that include logic blocks that can be configured to perform different functions. PLDs typically include different blocks to accommodate various logic functions and protocols. For instance, PLDs may have configurable elements that may be programmed or reprogrammed. These elements may be configured or programmed through random access memory (RAM) bits, registers, or other memory elements, among others.

Generally speaking, different settings can be set by changing the corresponding values of the configurable elements, e.g., a configurable RAM or CRAM. For instance, a transceiver block in a PLD can be reconfigured by changing specific values in a programmable register in the PLD. Settings of various configurable elements in the PLD may need to be reconfigured to accommodate multiple requirements. A transceiver block in a PLD, for example, may need to be reconfigured for various purposes, e.g., switching from one protocol to another, changing the data rate, etc.

Typically, in order to change or reconfigure some of the settings in a reconfigurable element, every word in the CRAM register, or any other elements that are used to store these settings, has to be reprogrammed. Even though the changes made may only affect a few words in the configuration register, every word in the register needs to be reprogrammed. Often times, in such cases, the same content is rewritten into the configuration register because only very few words in the configuration register are changed in the reconfiguration. This is time consuming as more words, i.e., configuration data values, than necessary are written to the configuration register.

Therefore, it is desirable to have a mechanism that writes or reprograms only the words that are different from the existing value in the configuration register. In other words, when a setting on a configurable element is changed or updated, only the corresponding configuration data values are changed. Configuration data values that are not affected by the change do not need to be rewritten.

It is within this context that the invention arises.

SUMMARY

Embodiments of the present invention include circuits and methods for configuring an integrated circuit (IC).

It should be appreciated that the present invention can be implemented in numerous ways, such as a process an apparatus, a system, a device or a method on a computer readable medium. Several inventive embodiments of the present invention are described below.

In one embodiment, a memory configuration circuit is disclosed. The memory configuration circuit includes a comparator that is coupled to receive two data words from two different memory configuration files. The comparator compares the two data words received and the output of the comparator determines if the second data word is written to a configuration memory. A counter in the memory configuration circuit increments a current address in the memory configuration files to a next memory address. In one embodiment, the memory configuration circuit is an input/output (I/O) reconfiguration controller that reconfigures an I/O element on an IC.

In another embodiment, a method for designing an IC is disclosed. The method includes generating a first design file to initialize an IC design. A second design file is then generated based on the first design file. A third design file is further generated based on a comparison of the first and second design files. The third design file that is generated contains instruction words from the second design file that are different from the first design file. The contents of the third design file are written to an IC design to update the IC design. The updated IC design contains portions of the first and second design files.

In yet another embodiment in accordance with the present invention, another method for configuring an IC is provided. The method includes receiving two memory initialization sources. A data value from the first memory initialization source is compared with a data value from the second memory initialization source. The second data value from the second memory initialization source is written to a configuration memory in the IC when the second data value is different from the first data value. An address value is incremented for each of the memory initialization sources.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings.

DETAILED DESCRIPTION

The following embodiments describe circuits and methods for configuring an integrated circuit (IC).

It will be obvious, however, to one skilled in the art, that the present invention may be practiced without some or all of these specific details. In other instances, well-known operations have not been described in detail in order not to unnecessarily obscure the present invention.

The embodiments described herein provide techniques to configure an IC with a user design without having to reconfigure the whole configuration memory. In one of the embodiments, a memory configuration circuit is used to determine which bits of the configuration memory need to be changed or reconfigured before writing the new configuration bits to the configuration memory. Bits that are similar or remain unchanged are not rewritten to the configuration memory. In another embodiment, a method for configuring and designing and IC design on an IC is provided. The method includes generating a design file that contains instruction or configuration words in an updated IC design file that are different from an original IC design file. The design file is used to configure the IC such that only instruction words that have changed from the original IC design file are written to the IC.

Figure 1:
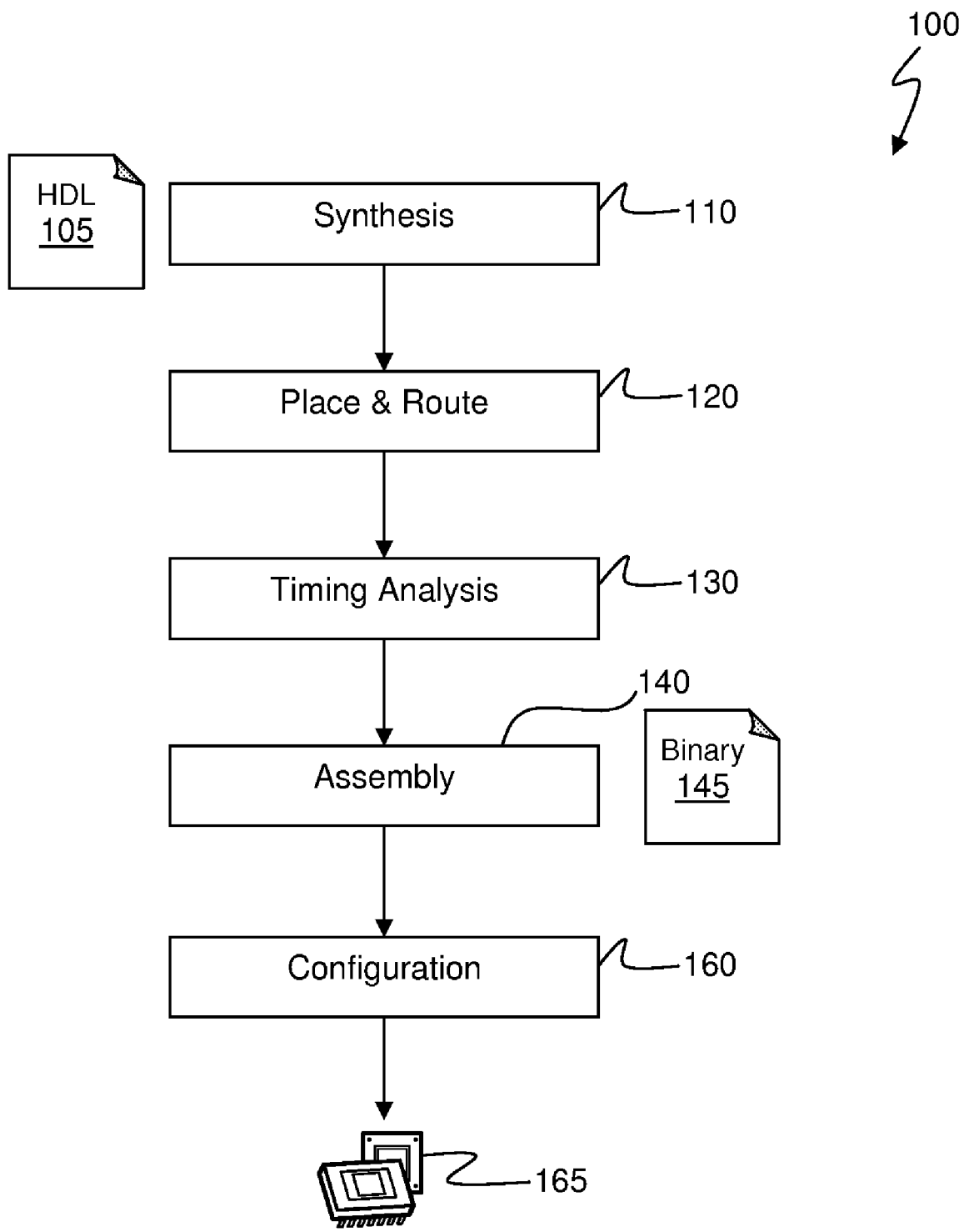
FIG. 1, meant to be illustrative and not limiting, shows a compilation flow to create a compiled design for an IC using an electronic design automation (EDA) tool, according to one embodiment.

FIG. 1, meant to be illustrative and not limiting, shows compilation flow 100 to create a compiled design for an IC using an electronic design automation (EDA) tool, according to one embodiment. The flow starts with an IC design created by a circuit developer or a hardware engineer that is embodied in a hardware description language (HDL) file 105. The IC design embodied in the HDL file is synthesized and translated into a discrete netlist of logic-gate primitives during synthesis operation 110. The synthesized logic gates and other components in the IC design are placed on the IC device during place and route operation 120. Wires are also added to connect the logic gates and all the other components in the IC to route signals in the IC design during place and route operation 120.

Referring still to FIG. 1, after place and route operation 120, timing analysis operation 130 assigns delays to the different logic gates and wires or routes in the circuit. Timing analysis operation 130 computes the lengths of different paths in the IC design and the timing constraints of the IC design, in one embodiment. Binary configuration file 145 is created during assembly operation 140. In one embodiment, binary configuration file 145 contains a description of the circuit of the IC design and is used to configure IC device 165 with the IC design during configuration operation 160. In an exemplary embodiment, certain elements on IC device 165, e.g. input/output (I/O) elements, may be reconfigured during runtime using the EDA tool. For instance, settings on a transceiver block on IC device 165 may be reconfigured, e.g., switching from one protocol to another, changing the data rate, etc., through modifications to the design files. In one embodiment, memory initialization files that are used to set specific memory bits that are associated with the particular block are modified when switching to a different protocol. Thus, the embodiments described herein may be applied to both the IC design process and the configuration process for an actual IC.

Figure 2:
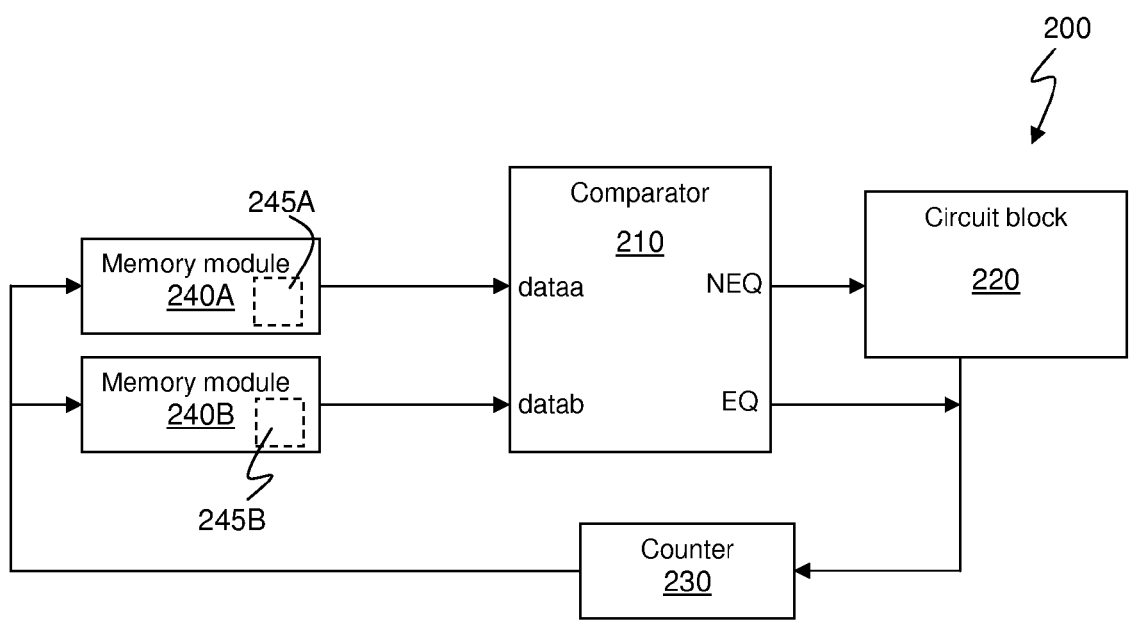
FIG. 2, meant to be illustrative and not limiting, shows a memory configuration circuit as one embodiment in accordance with the present invention.
Figure 6:
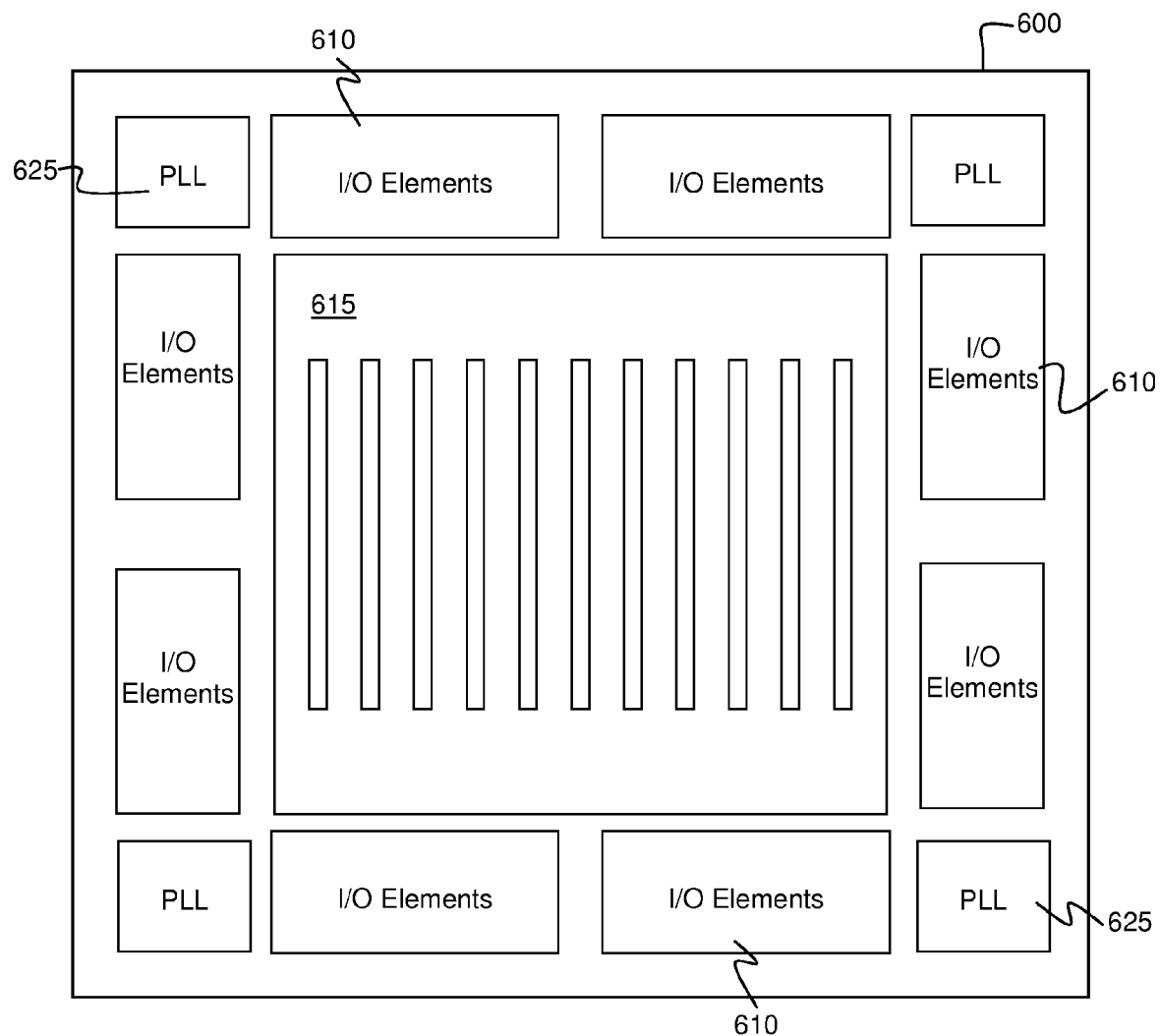
FIG. 6, meant to be illustrative and not limiting, shows a simplified block diagram of a programmable logic device (PLD) that can include aspects of the present invention.

FIG. 2, meant to be illustrative and not limiting, shows memory configuration circuit 200 as one embodiment in accordance with the present invention. In one embodiment, circuit 200 is a configuration circuit on a programmable logic device (PLD). In one such embodiment, configuration circuit 200 receives configuration sources from input/output (I/O) pins on the PLD. As such, the configuration sources received can be used to configure different parts of the PLD. In one embodiment, circuit 200 is a dynamic partial reconfigurable input/output (DPRIO) circuit that is used to reconfigure I/O elements on an IC. Therefore, one skilled in the art should appreciate that circuit 200 may be a circuit in a programmable device, e.g., programmable device 600 as shown in FIG. 6, that interact with other circuits within the device. Other blocks of such a device are not shown or described so as to not obscure the present invention.

Referring still to FIG. 2, memory configuration circuit 200 includes comparator circuit 210 coupled to memory modules 240A and 240B. In one embodiment, memory modules 240A and 240B are read-only memory (ROM) modules that are used to store configuration sources. In the illustrative embodiment of FIG. 2, memory modules 240A and 240B store configuration sources 245A and 245B, respectively. For instance, configuration sources 245A and 245B may be binary memory initialization files that have binary data values for addresses in a CRAM on a PLD. In one embodiment, configuration sources 245A and 245B are used to configure I/O elements on a PLD. In an exemplary embodiment, I/O elements on the PLD are initialized or configured with configuration source 245A and configuration source 245B is used to update or reconfigure the I/O elements.

Referring still to FIG. 2, comparator 210 receives data words or data values from configuration sources 245A and 245B and compares both values. If the data value from configuration source 245B is different from the data value from configuration source 245A, comparator 210 outputs a "not equal" signal. In the embodiment of FIG. 2, comparator 210 has two output terminals, i.e., NEQ and EQ. In one such embodiment, output terminal NEQ outputs a logic high signal to indicate that the data values received are not equal and EQ terminal outputs a logic high signal to indicate that the data values received are equal. It should be appreciated that either a logic high or a logic low signal can be used to represent different outcomes based on the comparison.

Referring still to FIG. 2, if the data value from configuration source 245B is different from the data value from configuration source 245A, a write operation is performed by circuit block 220 to write the data value from configuration source 245B to a configuration memory. It should be appreciated that circuit block 220 includes circuitry that performs the write operation to a memory module that may include physical mapping and protection of certain bits in the memory. For the sake of brevity, details of such circuitry are not included herein. If the data value from configuration source 245B is equal to the data value from configuration source 245A, the data value is not written to the configuration memory.

Continuing with FIG. 2, address counter 230 increases the address in the memory module to the next memory address. In one embodiment, address counter 230 is a memory initialization counter that increments a current address in the configuration memory to a next address so that a next data word can be taken in after the reconfiguration of the current address. Therefore, it should be appreciated that any counter or circuit that can keep track of a pointer in the memory module can be used in this context.

Figure 3:
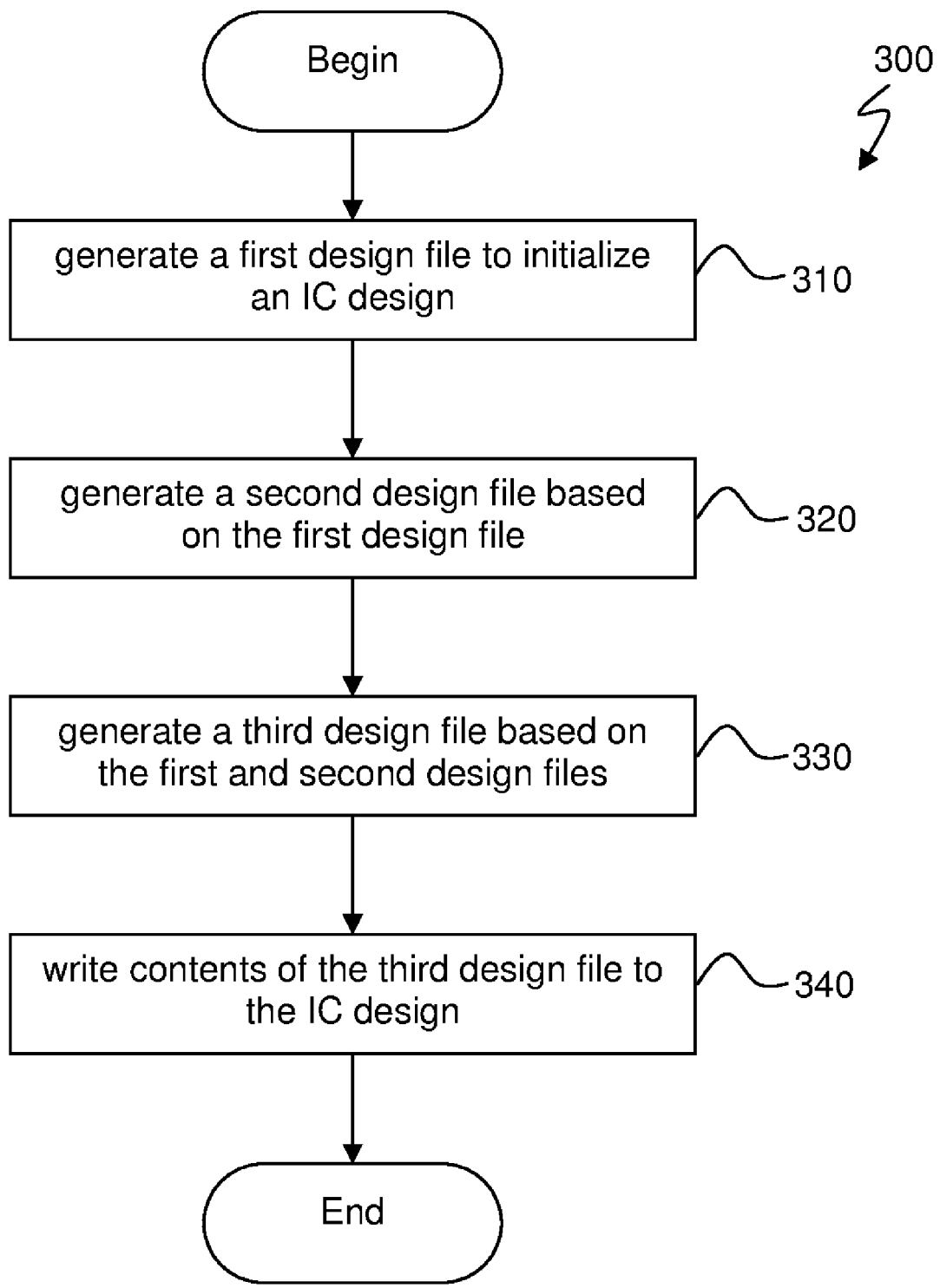
FIG. 3, meant to be illustrative and not limiting, shows a process flow to design an IC as another embodiment in accordance with the present invention.

FIG. 3, meant to be illustrative and not limiting, shows process flow 300 to design an IC as another embodiment in accordance with the present invention. The flow begins by generating a first design file in operation 310. In the embodiment of FIG. 3, the first design file is used to initialize a configuration memory module in an IC design. A second design file is generated based on the first design file in operation 320. In one embodiment, the second design file is generated based on the first design file and additional user-defined attributes. For instance, the first design file may contain a default design for a logic element while the second file may contain more user-specific attributes that are used to configure the logic element.

Referring still to FIG. 3, in operation 330, a third design file is generated based on a comparison of both the first and second design files. In an exemplary embodiment, the third design file is generated by comparing values in the first design file with values in the second design file. Values or attributes in the second design file that differ from the first design file are written to the third design file. In one embodiment, the first, second and third design files are all text files that contain configuration data in a pre-determined format. A format of such a configuration file is shown in the illustrative embodiment of FIG. 4A, details of which are described below.

Referring still to FIG. 3, contents of the third design file are written to the IC design in operation 340. In one embodiment, the contents are written to a CRAM module on the IC. In another embodiment, the IC design is updated after the writing the contents of the third design file to the IC design in operation 340. As such, the updated IC design includes portions of the previous or default design file, i.e., the first design file and portions of the second design file that are different from the first design file.

Figure 4A:
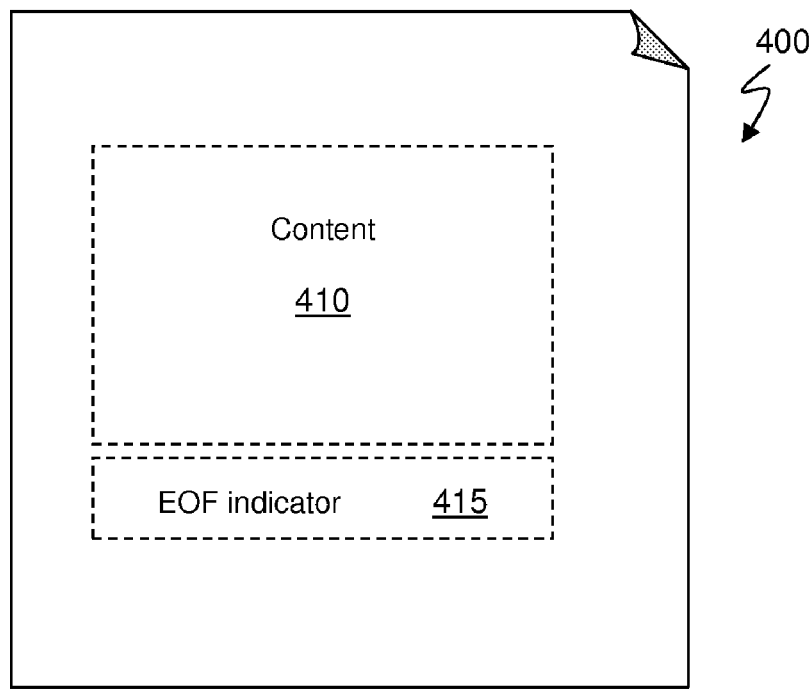
FIG. 4A, meant to be illustrative and not limiting, shows a format of a memory initialization file as one embodiment in accordance with the present invention.

FIG. 4A, meant to be illustrative and not limiting, shows a format of a memory initialization file 400 as one embodiment in accordance with the present invention. It should be appreciated that memory initialization file 400 may be a text file containing configuration information that can be read and used by an EDA tool similar to the one shown in FIG. 1 and described above. In one embodiment, memory initialization file 400 contains configuration data words that are different between two other memory initialization files. File 400 includes content 410 and an end-of-file (EOF) indicator 415. It should be appreciated that EOF indicator 415 may be a specific character or a specific string of characters that indicate the end of file 400, e.g., a string of digits. Content 410 includes configuration data words that are used to configure an IC design. In one embodiment, content 410 includes multiple lines of configuration words. In an exemplary embodiment, each configuration word is 22 bits wide with a configuration data field and an address field shown in FIG. 4B. In another embodiment, content 410 contains multiple word blocks, details of which are shown in FIG. 4C.

Figure 4B:
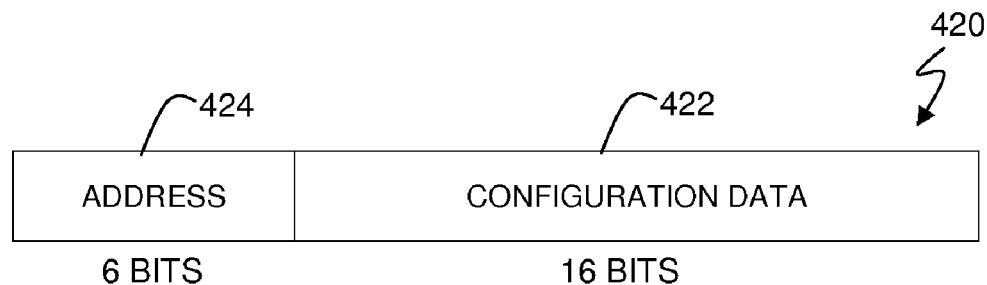
FIG. 4B, meant to be illustrative and not limiting, shows a 22-bit configuration data word, according to one embodiment.

FIG. 4B, meant to be illustrative and not limiting, shows a 22-bit configuration data word 420. Configuration data word 420 includes a configuration data field 422 and an address field 424. In one embodiment, configuration data field 422 holds a reconfiguration data value and address field 424 holds a specific address in a configuration memory module that needs to be reconfigured. Even though a total of 6 bits and 16 bits are used for address field 424 and configuration data field 422, respectively, it should be appreciated that more or fewer bits can be used in this context.

Figure 4C:
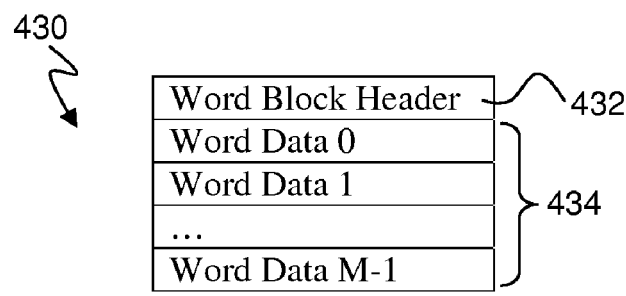
FIG. 4C, meant to be illustrative and not limiting, shows a word block as an embodiment in accordance with the present invention.

FIG. 4C, meant to be illustrative and not limiting, shows word block 430 as an embodiment in accordance with the present invention. In the embodiment of FIG. 4C, sequential and continuous data are grouped into word block 430. In an exemplary embodiment, each word in word block 430 is 16 bits wide. Header field 432 includes information on the number of lines in word block 430 and the starting memory address of word block 430. Configuration field 434 contains multiple lines of configuration data for each of the sequential memory addresses that follows from the starting memory address as indicated in header field 432.

Figure 5:
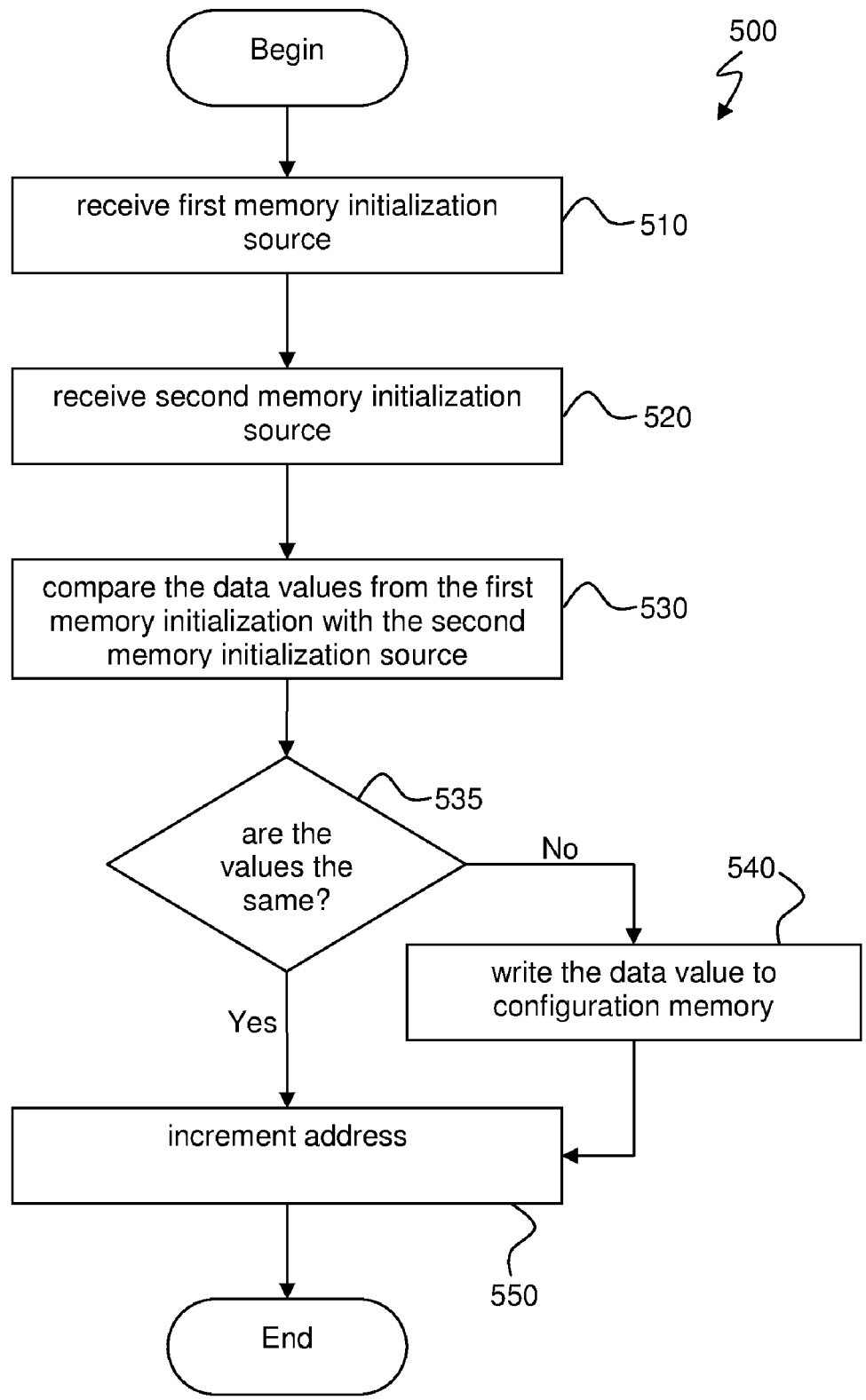
FIG. 5, meant to be illustrative and not limiting, shows a process flow to configure an IC as one embodiment in accordance with the present invention.

FIG. 5, meant to be illustrative and not limiting, shows process flow 500 to configure an IC as one embodiment in accordance with the present invention. Process flow 500 begins by receiving a first memory initialization source in operation 510. A second memory initialization source is received in operation 520. In one embodiment, the first and second memory initialization sources are stored in ROM modules. In the illustrative embodiment of FIG. 2, the first memory initialization source and the second memory initialization source are stored in ROMs 240A and 240B, respectively.

In one embodiment, the first and second memory initialization sources are memory initialization files used to configure an IC. For example, the first memory initialization file is used to initialize a logic block in the IC with default values, while the second memory initialization file contains user-defined attributes that can be used to update the configuration of the logic block. In an exemplary embodiment, a user or a circuit designer may want to reconfigure the settings of a transceiver block in the IC e.g., to switch between two different protocols, change the data rate, etc. This is done by updating or changing the corresponding CRAM bits in the IC.

Referring still to FIG. 5, data values from the first and second memory initialization sources are compared in operation 530. In an exemplary embodiment, the comparison in operation 530 is performed using a comparator circuit similar to comparator circuit 210 shown in FIG. 2. If the data value from the second memory initialization source is determined to be different from the data value from the first memory initialization source in operation 535, the data value from the second memory initialization source is written to a configuration memory in operation 540.

Referring still to FIG. 5, a configuration memory address is incremented in operation 550. In one embodiment, the configuration memory address is incremented after the reconfiguration of the current data word is completed so that the next data word can be configured. In an exemplary embodiment, an IC is configured with an IC design based on the first memory initialization source and the second memory initialization source is used to update the IC design by reconfiguring the IC based on the updated data values in the second memory initialization source. It should be appreciated that the first and second memory initialization sources may be files that contain multiple configuration data values. As such operations 510-540 may be repeated for every configuration data value in the first and second memory initialization sources.

FIG. 6, meant to be illustrative and not limiting, shows a simplified block diagram of PLD 600 that can include aspects of the present invention. Programmable device 600 includes logic region 615 and I/O elements 610. I/O elements 610 may support a variety of memory interfaces. Other auxiliary circuits such as phase-locked loops (PLLs) 625 for clock generation and timing, can be located outside the core logic region 615, e.g., at corners of programmable device 600 and adjacent to I/O elements 610. Logic region 615 may be populated with logic cells which include, among other things, at the most basic level, "logic elements" (LEs). LEs may include look-up table-based logic regions and these logic elements may be grouped into "Logic Array Blocks" (LABs). The logic elements and groups of logic elements or LABs can be configured to perform logical functions desired by the user. Logic region 615 may also include logic elements that can be configured as memory configuration circuit 200 as shown in the embodiment of FIG. 2.

Figure 7:
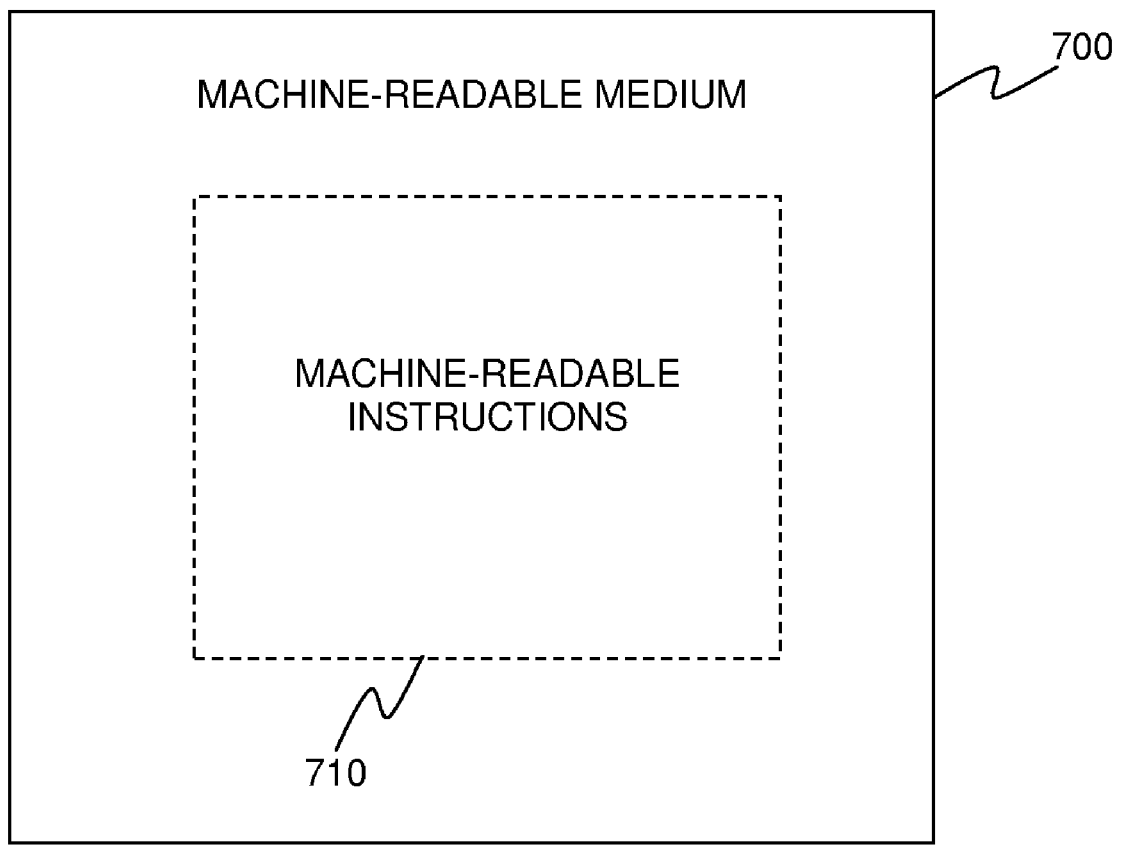
FIG. 7 is a simplified block diagram showing a machine-readable medium encoded with machine-readable instructions as an embodiment in accordance with the present invention.

The invention can also be embodied as machine-readable instructions 710 on machine-readable storage medium 700 as shown in FIG. 7. Machine-readable storage medium 700 is any data storage device that can store data, which can thereafter be read by a machine or a computer system. Illustrative examples of machine-readable storage medium 700 include hard drives, network attached storage (NAS), read-only memory, random-access memory, CDs, DVDs, USB drives, volatile and non-volatile memory, and other optical and nonoptical data storage devices. Machine-readable storage medium 700 can also be distributed over a network-coupled computer system so that machine-readable instructions 710 are stored and executed in a distributed fashion. Machine-readable instructions 710 can perform any or all of the operations illustrated in FIGS. 1, 3 and 5.

Figure 8:
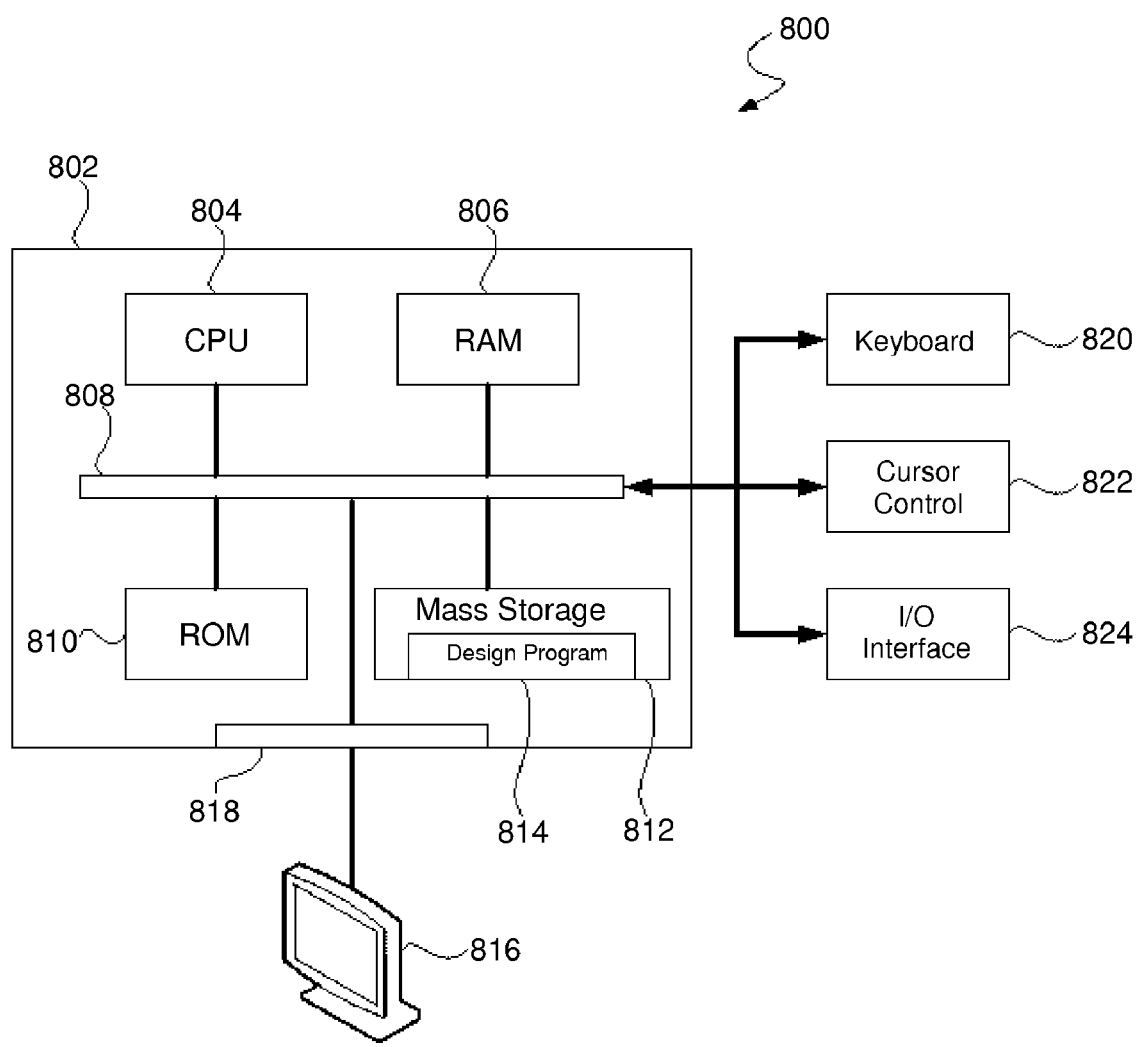
FIG. 8 is a simplified schematic diagram of a computer system for implementing embodiments of the present invention.

FIG. 8 is a simplified schematic diagram of a computer system 800 for implementing embodiments of the present invention. It should be appreciated that the methods described herein may be performed with a digital processing system, such as a conventional, general-purpose computer system. Special-purpose computers, which are designed or programmed to perform one function may be used in the alternative. The computer system includes a central processing unit (CPU) 804, which is coupled through bus 808 to random access memory (RAM) 806, read-only memory (ROM) 810, and mass storage 812. Mass storage device 812 represents a persistent data storage device such as a floppy disc drive or a fixed disc drive, which may be local or remote.

Referring still to FIG. 8, design program 814 resides in mass storage 812, but can also reside in RAM 806 during processing. Design program 814 also includes a file generator tool that can perform any or all of the operations illustrated in FIG. 3 and additional functionality described herein. It should be appreciated that CPU 804 may be embodied in a general-purpose processor, a special-purpose processor, or a specially programmed logic device. Display 816 is in communication with CPU 804, RAM 806, ROM 810, and mass storage device 812, through bus 808 and display interface 818. Keyboard 820, cursor control 822, and interface 824 are coupled to bus 808 to communicate information in command selections to CPU 804. It should be appreciated that data to and from external devices may be communicated through interface 824.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A memory configuration circuit comprising:
a first read only memory (ROM) and a second ROM, a first memory configuration data stored within the first ROM, and a second memory configuration data stored within the second ROM, wherein the second memory configuration data is an update to the first memory configuration data;
a configuration memory that is neither the first ROM nor the second ROM;
a comparator coupled to receive a first data word and a second data word associated with the first memory configuration data stored within the first ROM and the second memory configuration data stored within the second ROM, respectively, wherein the comparator is operable to compare the first data word and the second data word to determine whether the second data word is written to the configuration memory; and
a counter for incrementing an address of the first and second memory configuration data.

2. The memory configuration circuit of claim 1, wherein the second data word updates the configuration memory in a reconfiguration operation, and wherein the counter increments the address of the first memory configuration data and the second memory configuration data after the reconfiguration operation.

3. The memory configuration circuit of claim 2, wherein the memory configuration circuit is an input/output (I/O) reconfiguration controller operable to reconfigure an I/O element on an integrated circuit (IC).

4. The configuration circuit of claim 1, wherein the first and second configuration data are memory initialization files having data values for a plurality of addresses in the configuration memory.

5. The configuration circuit of claim 1, wherein the comparator determines that the second data word is written to the configuration memory if the second data word is different from the first data word.

6. The memory configuration circuit of claim 1, wherein the memory configuration circuit is integrated into a programmable logic device (PLD) and wherein the configuration memory is a configuration random access memory (CRAM) register in the PLD.

7. A method of designing an integrated circuit (IC), said method comprising:
generating a first design file operable to initialize a memory of an IC design;

subsequent to said generating said first design file, generating a second design file based on the first design file, wherein user defined attributes of the second design file vary from user defined attributes of the first design file;

generating a third design file based on a comparison of the first and second design files, wherein the third design file contains a plurality of user defined attributes, the plurality of user defined attributes representing a circuit of the IC design, and wherein the generating of the third design file based on the comparison comprises modifying the plurality of user defined attributes from the second design file for the third design file; and writing content of the third design file to update the IC design, wherein the updated IC design includes portions of the first and second design files.

8. The method of claim 7, wherein the content of the third design file is a text file.

9. The method of claim 7, wherein each operation is embodied in a machine-readable medium as machine-readable instructions.

10. The method of claim 7, wherein the second design file is generated based on the first design file and a plurality of user-defined attributes.

11. The method of claim 7, further comprising:
comparing a first data value from the first design file with a second data value from the second design file; and
writing the second data value from the second design file to the third design file in response to a mismatch between the second data and the first data.

12. The method of claim 11, further comprising:
repeating the comparing and the writing for each of a plurality of data values in the first and second design files; and
appending an end-of-file indicator to the third design file after each of the plurality of data values in the first and second design files is compared.

13. The method of claim 11, wherein the writing the second data value to the third design file comprises:
writing a configuration data value as a plurality of least significant bits (LSBs) of an instruction word; and
writing a corresponding memory address to remaining bits of the instruction word.

14. The method of claim 11, wherein the writing to the third design file comprises writing a word block comprising a header having a first plurality of bits representing a number of lines in the word block, a second plurality of bits representing a first memory address of the word block, and a plurality of configuration data values for a plurality of sequential memory addresses beginning from the first memory address.

15. A method of configuring an integrated circuit (IC), said method comprising:
receiving a first memory initialization data operable to initialize a logic block of the IC;
storing the first memory initialization data in a first memory module in the IC;
subsequent to storing the first memory initialization file, receiving a second memory initialization data as an update to the first memory initialization data;
storing the second memory initialization data in a second memory module in the IC;
comparing a first data value from the first memory initialization data with a second data value from the second memory initialization data;
writing the second data value to a configuration memory of the IC in response to determining a mismatch between the second data value and the first data value; and
incrementing an address of each of the configuration memory of the IC and the first and second memory modules in the IC.

16. The method of claim 15, wherein each method operation is repeated for every data value in the first memory initialization data and second memory initialization data.

17. The method of claim 15, wherein the IC is configured with an IC design based on the first memory initialization data and the writing of the second data to the configuration memory updates the IC design.

18. The method of claim 15, wherein the incrementing is performed after completion of the writing operation.

19. The method of claim 15, wherein the writing the second data value is based on an output of a comparator.

* * * * *